United States Patent
Nicke et al.

(10) Patent No.: US 11,005,172 B2
(45) Date of Patent: May 11, 2021

(54) METHOD FOR PRODUCING A RADOME AND CORRESPONDING RADOME

(71) Applicant: HELLA GMBH & CO. KGAA, Lippstadt (DE)

(72) Inventors: Wolfgang Nicke, Lörrach (DE); Thomas Rost, Freiburg (DE); Roland Schwarz, Todtnau (DE); David Allouis, Bad Iburg (DE)

(73) Assignee: HELLA GMBH & CO. KGAA, Lippstadt (DE)

( * ) Notice: Subject to any disclaimer, the term of this patent is extended or adjusted under 35 U.S.C. 154(b) by 0 days.

(21) Appl. No.: 15/764,460

(22) PCT Filed: Sep. 21, 2016

(86) PCT No.: PCT/EP2016/072405
§ 371 (c)(1),
(2) Date: Mar. 29, 2018

(87) PCT Pub. No.: WO2017/055153
PCT Pub. Date: Apr. 6, 2017

(65) Prior Publication Data
US 2018/0287252 A1    Oct. 4, 2018

(30) Foreign Application Priority Data

Sep. 30, 2015    (DE) ............... 10 2015 218 876.0

(51) Int. Cl.
*H01Q 1/02*    (2006.01)
*H01Q 1/32*    (2006.01)
(Continued)

(52) U.S. Cl.
CPC ....... *H01Q 1/425* (2013.01); *B29C 45/14377* (2013.01); *B29C 45/14639* (2013.01);
(Continued)

(58) Field of Classification Search
CPC ...... H01Q 1/02; H01Q 1/1278; H01Q 1/3233; H01Q 1/42; H01Q 1/422; H01Q 1/425;
(Continued)

(56) References Cited

U.S. PATENT DOCUMENTS 5,617,107 A * 4/1997 Fleming ............ H01Q 1/02
                                                    343/704
6,433,753 B1 * 8/2002 Zimmermann ....... H01Q 1/02
                                                    219/522
(Continued)

FOREIGN PATENT DOCUMENTS

CN    1249070 A    3/2000
DE    198 04 607 A1    10/1999
(Continued)

OTHER PUBLICATIONS

International Search Report, PCT/EP2016/072405, dated Nov. 28, 2016, 3 pgs.
(Continued)

*Primary Examiner* — Dimary S Lopez Cruz
*Assistant Examiner* — Patrick R Holecek
(74) *Attorney, Agent, or Firm* — Paul D. Strain, Esq.; Strain & Strain PLLC

(57)    ABSTRACT

The invention relates to a method for producing a radome, a flexible printed circuit board having a metallic structure being used. Said flexible printed circuit board is embossed and is back-molded with a thermoplastic material and electric contact elements are connected to the flexible printed circuit board. A connector skirt is placed on the contact elements prior to back-molding.

10 Claims, 3 Drawing Sheets

(51) Int. Cl.
*H01Q 1/42* (2006.01)
*B29C 45/14* (2006.01)
*H05K 1/02* (2006.01)
*G01S 13/931* (2020.01)
*H05B 3/36* (2006.01)
*H05B 3/84* (2006.01)
*B29L 31/34* (2006.01)
*B29L 31/36* (2006.01)
*G01S 7/40* (2006.01)

(52) U.S. Cl.
CPC ...... *B29C 45/14836* (2013.01); *G01S 13/931* (2013.01); *H01Q 1/02* (2013.01); *H01Q 1/3233* (2013.01); *H01Q 1/42* (2013.01); *H05B 3/36* (2013.01); *H05B 3/84* (2013.01); *H05K 1/028* (2013.01); *H05K 1/0212* (2013.01); *B29L 2031/3456* (2013.01); *B29L 2031/36* (2013.01); *G01S 2007/4047* (2013.01); *G01S 2013/9327* (2020.01); *H05B 2203/016* (2013.01); *H05K 2201/09754* (2013.01); *H05K 2201/10189* (2013.01); *H05K 2203/1327* (2013.01)

(58) Field of Classification Search
CPC ........ H01Q 1/427; H01Q 1/32; H01Q 1/3208; H01Q 1/325; H01Q 1/3283; H01Q 1/3291; H01Q 1/38; H01Q 1/40; B29C 45/14639; B29C 45/14836; G01S 13/931; G01S 2013/9327; G01S 2007/4047; B29L 2031/3456; B29L 2031/36; H05B 2203/016; H05B 3/36; H05B 3/84; H05K 2201/09754; H05K 2201/10189; H05K 2203/1327; H05K 1/0212; H05K 1/028
See application file for complete search history.

(56) References Cited

U.S. PATENT DOCUMENTS

| | | | |
|---|---|---|---|
| 7,166,819 B2 * | 1/2007 | Winter | B60S 1/0848 |
| | | | 219/202 |
| 7,326,894 B2 * | 2/2008 | Meiler | H01Q 1/02 |
| | | | 219/663 |
| 7,420,502 B2 * | 9/2008 | Hartzstein | G01S 7/032 |
| | | | 342/175 |
| 9,496,602 B2 * | 11/2016 | Kasar | H01Q 1/42 |
| 9,559,421 B2 * | 1/2017 | Nakamura | H01F 5/04 |
| 2006/0086710 A1 | 4/2006 | Meiler et al. | |
| 2011/0221640 A1 * | 9/2011 | Huber | H01Q 1/1214 |
| | | | 343/713 |

FOREIGN PATENT DOCUMENTS

| | | | |
|---|---|---|---|
| DE | 103 52 044 A1 | 6/2005 | |
| DE | 10 2005 042 248 B3 | 2/2007 | |
| DE | 197 54 616 B4 | 9/2007 | |
| DE | 10 2009 055 360 A1 | 4/2011 | |
| DE | 10 2013 012 785 A1 | 2/2015 | |
| DE | 10 2014 002 438 A1 | 8/2015 | |
| EP | 2 741 105 A2 | 6/2014 | |
| GB | 885131 A * | 12/1961 | ............. B64D 15/12 |

OTHER PUBLICATIONS

German Search Report, Appl. No. 10 2015 218 876.0, dated Apr. 8, 2016, 9 pgs.

Walter Michaeli et al., "Neuer Prozess für Kunststoff-Metall-Hybride", Carl Hanser Verlag, München, Kunststoffe Sep. 2010, 4 pgs.

* cited by examiner

METHOD FOR PRODUCING A RADOME AND CORRESPONDING RADOME

CROSS-REFERENCE TO RELATED PATENT APPLICATIONS

This application is a National Stage of International Application No. PCT/EP2016/072405, filed Sep. 21, 2016, which is based upon and claims the benefit of priority from prior German Patent Application No. 10 2015 218 876.0, filed Sep. 30, 2015, the entire contents of all of which are incorporated herein by reference in their entirety.

TECHNICAL FIELD

The invention relates to a radome, in particular for a motor vehicle, and to a method for producing a radome.

PRIOR ART

Radomes are covers, which are substantially transparent to radar beams, of a radar sensor that emits radar beams, and preferably also receives them again, in order to be able on this basis to produce an image of the surroundings of the radar sensor or to be able to generate information in this respect.

Such radomes are used in motor vehicles in order to be able to cover radar sensors, for example in the front end of the vehicle, to protect the radar sensor from dirt, water, ice or snow and other unwanted infuences. It is known in this respect that the radome may also be electrically heated, in order for example that in winter icing, a layer of water or a layer of snow can be avoided or removed. This is desired because the function of the radar sensor is sometimes greatly impaired by such a layer.

Such radomes are disclosed for example by DE 10 2013 012 785 A1. There, a series of wires are placed between two films which are thermoformed and back-molded with a plastic. The contacting of the radome is in that case of a kind that uses a contact plate which is in connection with the placed-in wires.

Such designs tend to be complicated and/or expensive.

SUMMARY OF THE INVENTION, PROBLEM, SOLUTION, ADVANTAGES

The invention therefore addresses the problem of providing a radome that can be produced in an easy and uncomplicated way and nevertheless can be electrically contacted easily. The invention also addresses the problem of providing a method for producing a radome that provides an easy and inexpensive procedure for producing a radome.

The problem according to the invention with respect to the method is solved by the features of claim 1.

An exemplary embodiment of the invention relates to a method for producing a radome, wherein a flexible printed circuit board with a metallic structure is used and is back-molded with a thermoplastic material and electrical contact elements are connected to the flexible printed circuit board, a connector skirt being placed onto the contact elements before the back-molding. As a result, the contact elements connected to the flexible printed circuit board can be protected during the back-molding, in particular in the injection mold. The connector skirt is in this case placed over the contact elements and connected to the flexible printed circuit board by means of back-molding the plastics material.

It is particularly advantageous in this case if the flexible printed circuit board consists of a flexible film that has a metallic structure. As a result, a simple design can be achieved, while at the same time the strength of the film can also be influenced, for example by choosing laminated films.

It is particularly advantageous if the contact elements are connected to the metallic structure in an electrically conducting manner. As a result, a good connection of the metallic structure to a circuit can take place, in order to use the metallic structure as a means of electrical heating.

It is also advantageous if, by the back-molding of the thermoplastic material, the connector skirt is secured on the film. This allows the connector skirt also to be secured in one step.

It is also particularly advantageous if, by the back-molding of the thermoplastic material, the connector skirt is formed as one part with the back-molded plastic, to form a base plate. As a result, the connector skirt is encapsulated with the thermoplastic material and connected to it as one part, and the base plate is thereby created.

It is in this case particularly advantageous if the thermoplastic material is back-molded on the side of the film with the metallic structure. As a result, the metallic structure is covered over and protected by the thermoplastic material.

It is also advantageous if the sheet-like plastic element thus created is connected to a front panel. As a result, the radome can for example be adapted to the vehicle front end of a motor vehicle.

The problem according to the invention with respect to the radome is solved by the features of claim 8.

An exemplary embodiment of the invention relates to a radome which has a sheet-like plastic element with a metallic structure, wherein the plastic element consists of a film with back-molded thermoplastic material, a contact element which is connected to the film and is covered by a connector skirt being provided.

Further advantageous refinements are described by the following description of the figures and by the subclaims.

BRIEF DESCRIPTION OF THE DRAWINGS

The invention is explained in more detail below on the basis of at least one exemplary embodiment with reference to the figures of the drawing, in which.

PREFERRED EMBODIMENT OF THE INVENTION

Figure 1:
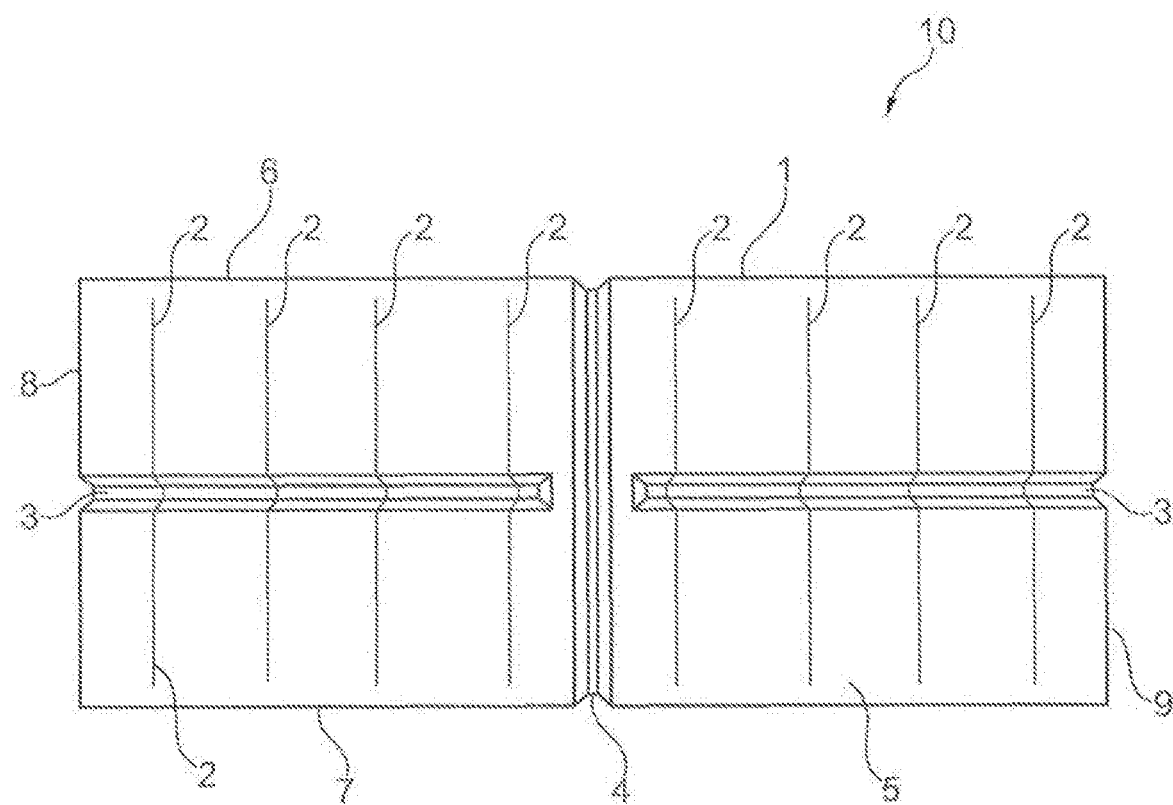
FIG. 1 shows a schematic representation of a radome according to the invention.

FIG. 1 shows a flexible printed circuit board 1, formed as a film 5, with a metallic structure 2. The film 5 is formed as substantially rectangular and has groove-like impressions 3, 4. The impressions 3, 4 are provided in various configurations. One of the impressions 4 runs through the film 5 from the top to the bottom in FIG. 1, from one longitudinal side 6 to the opposite longitudinal side 7. The other two impressions 3 run from one of the narrow sides 8, 9 in each case in the direction of the middle, but they do not extend as far as the middle.

The metallic structure 2 consists of linear metallic ridges, which may be produced from a sheet-like metallic structure.

This film 5 is coated by back-molding with a thermoplastic material. This can be seen in FIG. 2.

Figure 2:
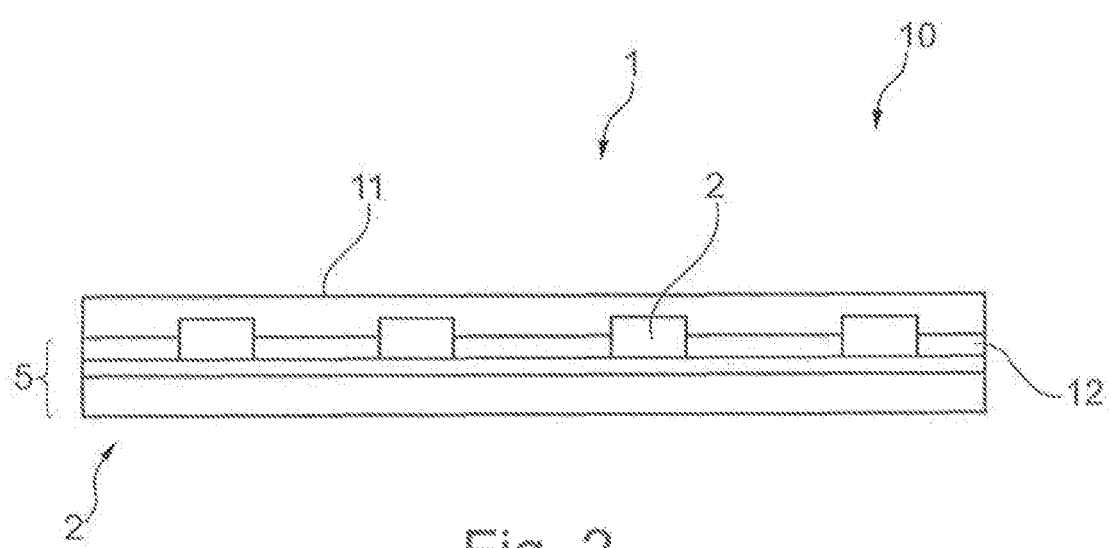
FIG. 2 shows a sectional representation of the radome.

FIG. 2 shows a section of a radome 10, wherein a flexible printed circuit board 1, which is formed in particular as a film 5 and has a metallic structure 2. In a form given by way of example, the metallic structure 2 is provided by means of linear strips, but it may also be formed in other ways.

The flexible printed circuit board 1 is hot stamped and has impressions 3, 4, which cannot however be seen in FIG. 2. Furthermore, the flexible printed circuit board 1 is back-molded with a thermoplastic material 11. In this case, the back-molded plastic 11 is applied on the side of the film 5 on which the metallic structure 2 is applied. The back-molded plastic in this case covers the metallic structure, at least in certain regions.

The film 5 is preferably a laminate film, such as in particular a metallized laminate film of plastic. In this case, the film is preferably a film that comprises PI, PEN or PC. Here, PI stands for polyimide, PC for polycarbonate and PEN for polyethylene naphthalate.

The metallization advantageously consists of copper. The metallization or its structure may be vapor-deposited. Alternatively, the metallization may also consist of some other material, for example of aluminum or the like. The application of the structure may also be performed in some other way.

To improve the adhesive bonding of the back-molded plastic 11 on the film 5, a predefined surface structure may be produced, such as for example by a pretreatment. As a result, a layer 12 that preferably serves for increased bonding with the back-molded plastic is created on the surface of the film. The surface structure may for example be obtained by stamping impressions into a surface layer of the liquid, adhesive-like component of the film.

Figure 3:
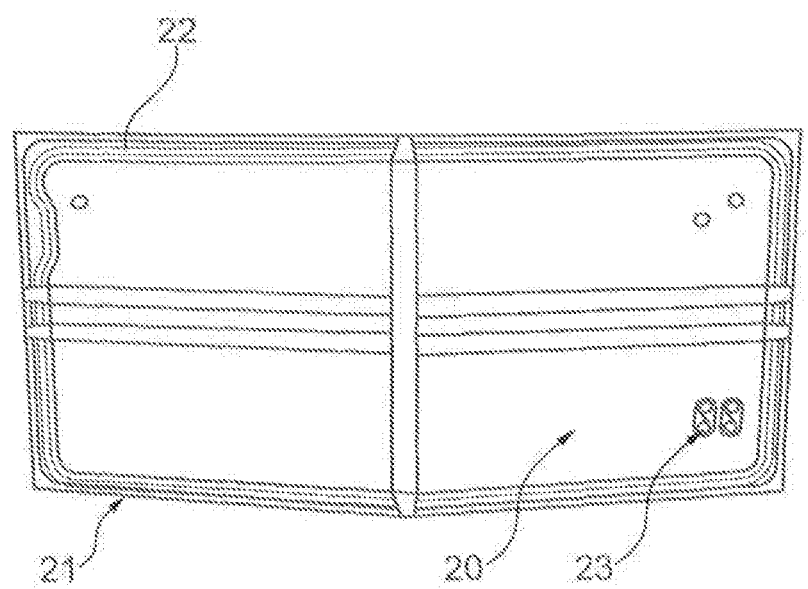
FIG. 3 shows a schematic representation of a further exemplary embodiment.

FIG. 3 shows further exemplary embodiment of a back-molded film 20. This film is back-molded with a thermoplastic material 21, which also projects beyond the film 20 at the edge 22. Incorporated terminal contacts 23 can also be seen, for the electrical contacting of the metallic structure, which cannot however be seen in FIG. 3.

Figure 4:
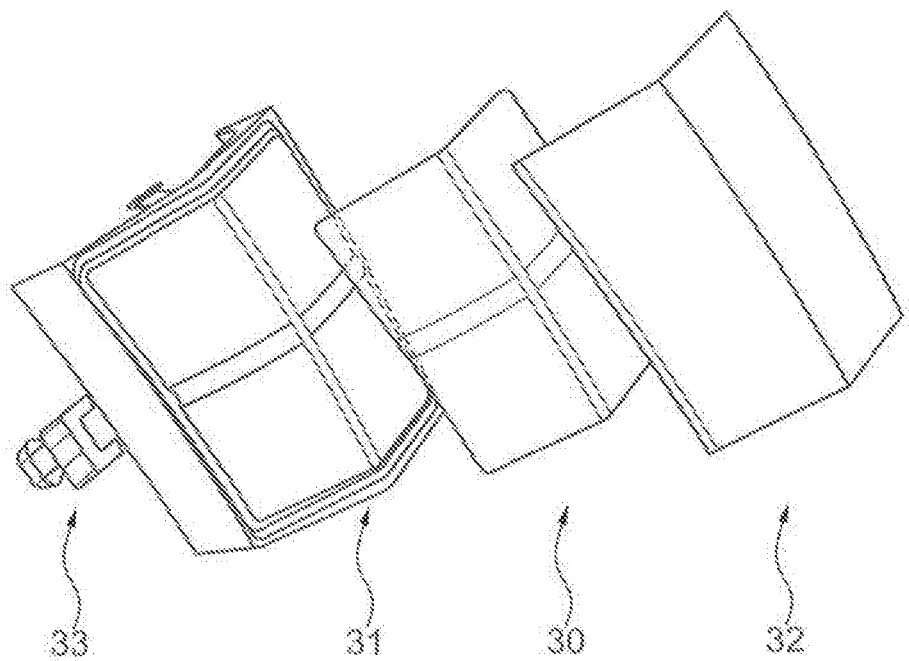
FIG. 4 shows an exploded representation of the radome as shown in FIG. 3 with a front panel.

FIG. 4 shows a kind of exploded representation comprising a film 30 with metallization. This film is back-molded with a thermoplastic material and forms the element, shown on the left, of the film with back-molded plastic 31. A front panel 32 may be arranged on it. Furthermore, a connector 33 can also be seen, serving for the electrical connection of the heatable radome.

Figure 5:
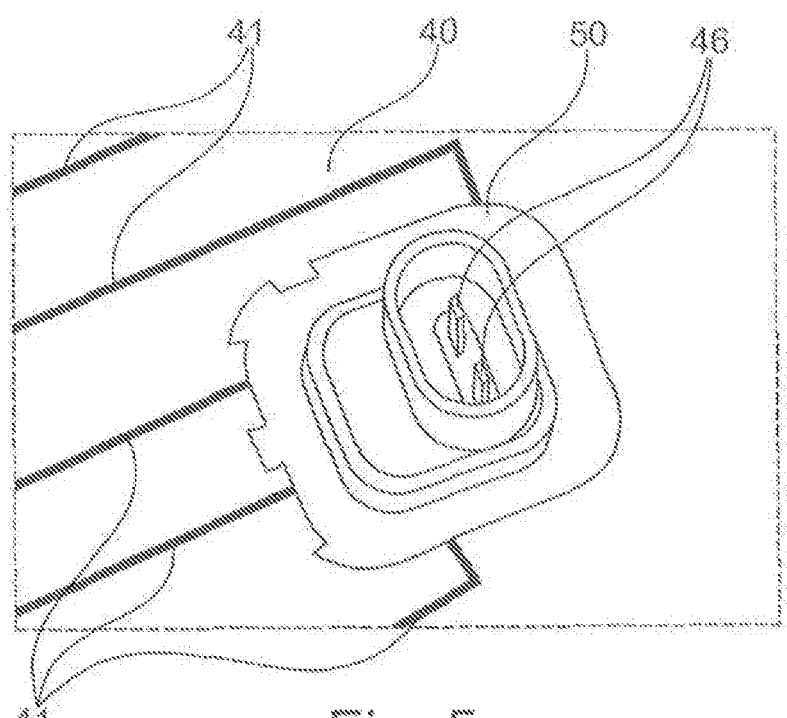
FIG. 5 shows a partial view of a flexible printed circuit board with a metallic structure and with contact elements that are covered by a connector skirt and FIG. 6 shows a representation of the connector skirt with back-molding of the flexible printed circuit board and encapsulation of the connector skirt.

FIG. 5 shows how a connector skirt 50 is placed onto the flexible printed circuit board 40, the electrical contacts 46 protruding as contact elements through openings in the connector skirt 50. Subsequently, the connector skirt 50 is encapsulated by back-molding the thermoplastic material 60, see FIG. 6, and the thermoplastic material 60 is back-molded onto the flexible printed circuit board 40 formed as a film. The connector skirt is thereby connected to the flexible printed circuit board by the encapsulation and back-molding, and, by the back-molding of the thermoplastic material 60, the connector skirt 50 is connected as one part to the back-molded plastic 60, to form a base plate.

The flexible printed circuit board 40 is in this case advantageously produced from a flexible film that has a metallic structure 41.

Figure 6:
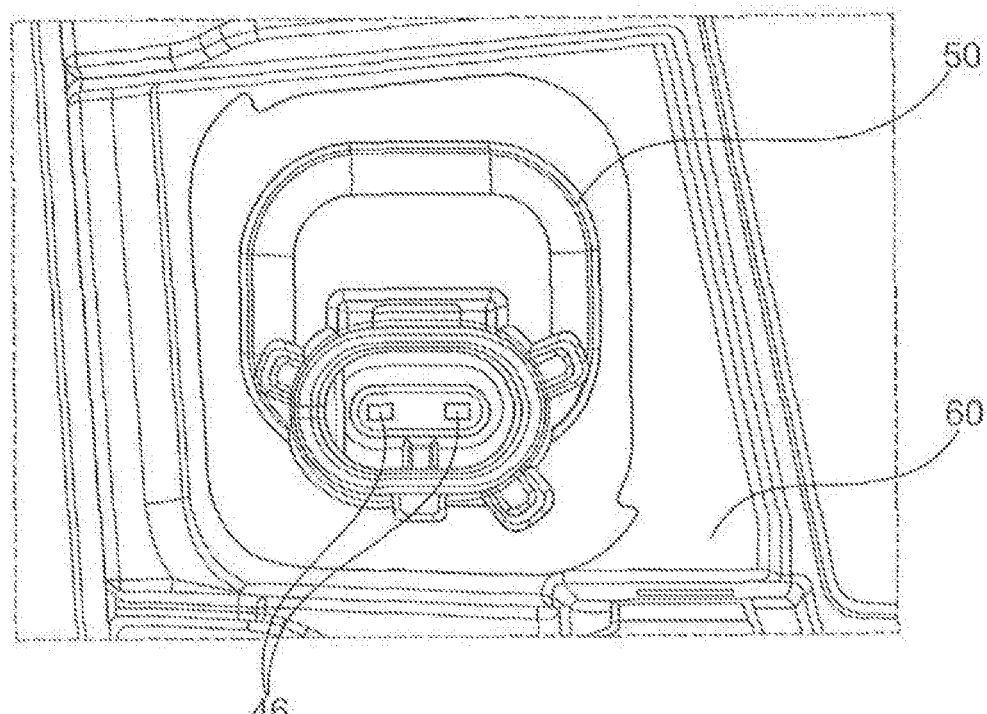

FIGS. 5 and 6 show that the electrical contact is partially covered by the connector skirt 50 and partially reaches through an opening in the connector skirt 50.

In this case, the thermoplastic material 60 is back-molded on the side of the film with the metallic structure 41.

LIST OF DESIGNATIONS 1 flexible printed circuit board
2 metallic structure
3 impression
4 impression
5 film
6 longitudinal side
7 longitudinal side
8 narrow side
9 narrow side
10 radome
11 back-molded plastic
12 layer
20 back-molded film
21 thermoplastic material
22 edge
23 terminal contact
30 film
31 film with back-molded plastic
32 front panel
33 connector
40 flexible printed circuit board
41 metallic structure
46 electrical contact, electrical contact element
50 connector skirt
60 back-molded plastic

The invention claimed is:

1. A radome comprising:
a sheet-like plastic element comprising a laminate film connected to a back-molded thermoplastic material, wherein the laminate film is flexible and comprises an etched metallized structure arranged on one side of the laminate film and configured to carry an electric current to heat the radome; and
a contact element arranged on the laminate film and electrically connected to the metallized structure, wherein at least a portion of the contact element protrudes through a connector skirt provided on the laminate film, wherein at least a first portion of the connector skirt is arranged between the laminate film and the back-molded thermoplastic material, wherein at least a second portion of the connector skirt is accessible externally of the radome.

2. The radome as claimed in claim 1, further comprising a front panel attached to the plastic element.

3. The radome as claimed in claim 1,
wherein the laminate film comprises a polyimide film or a polyethylene naphthalate film.

4. The radome as claimed in claim 1,
wherein the back-molded thermoplastic material is arranged on the side of the laminate film having the metallized structure.

5. The radome as claimed in claim 1,
wherein the metallized structure comprises copper or aluminum.

6. The radome as claimed in claim 1,
wherein the side of the laminate film adjacent to the back-molded thermoplastic material comprises a discrete layer of the laminate having a surface structure obtained by mechanical or chemical pretreatment prior to attachment of the back-molded thermoplastic material such that an interlocking between the laminate film and the back-molded thermoplastic material is achieved, which increases a bond strength between the laminate film and the back-molded thermoplastic material.

7. The radome as claimed in claim 6,
wherein the surface structure comprises impressions generated by mechanical stamping of the plastic element.

8. The radome as claimed in claim 1,
wherein the laminate film comprises two long sides and two short sides, wherein a first groove-like impression in the laminate film runs between the two long sides, wherein a second and third groove-like impression in the laminate film run from the two short sides toward a center region, each terminating before reaching the first groove-like impression.

9. The radome as claimed in claim 8,
wherein the metallized structure comprises strips of metallic material arranged parallel to the first groove-like impression.

10. A radome comprising:
a sheet-like plastic element comprising a laminate film connected to a back-molded thermoplastic material, wherein the laminate film is flexible and comprises an etched metallized structure arranged on one side of the laminate film and configured to carry an electric current to heat the radome; and
a contact element arranged on the laminate film and electrically connected to the metallized structure, wherein at least a portion of the contact element protrudes through a connector skirt provided on the laminate film, wherein at least a first portion of the connector skirt is arranged between the laminate film and the back-molded thermoplastic material, wherein at least a second portion of the connector skirt is accessible externally of the radome,
wherein the back-molded thermoplastic material is arranged on the side of the laminate film having the metallized structure, wherein the metallized structure comprises copper or aluminum,
wherein the side of the laminate film adjacent to the back-molded thermoplastic material comprises a discrete layer of the laminate having a surface structure obtained by mechanical or chemical pretreatment prior to attachment of the back-molded thermoplastic material such that an interlocking between the laminate film and the back-molded thermoplastic material is achieved, which increases a bond strength between the laminate film and the back-molded thermoplastic material,
wherein the surface structure comprises impressions generated by mechanical stamping of the plastic element,
wherein the laminate film comprises two long sides and two short sides, wherein a first groove-like impression in the laminate film runs between the two long sides, wherein a second and third groove-like impression in the laminate film run from the two short sides toward a center region, each terminating before reaching the first groove-like impression.

* * * * *